(12) United States Patent
Dogruoz et al.

(10) Patent No.: US 10,153,261 B2
(45) Date of Patent: Dec. 11, 2018

(54) COOLING SYSTEM FOR HIGH POWER APPLICATION SPECIFIC INTEGRATED CIRCUIT WITH EMBEDDED HIGH BANDWIDTH MEMORY

(71) Applicant: CISCO TECHNOLOGY, INC., San Jose, CA (US)

(72) Inventors: Baris Dogruoz, Santa Clara, CA (US); Vic Chia, Sunnyvale, CA (US); M. Onder Cap, Sunnyvale, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 15/477,942

(22) Filed: Apr. 3, 2017

(65) Prior Publication Data

US 2018/0286844 A1 Oct. 4, 2018

(51) Int. Cl.
*H01L 23/34* (2006.01)
*H01L 25/18* (2006.01)
*H01L 23/427* (2006.01)
*H01L 23/367* (2006.01)

(52) U.S. Cl.
CPC .......... *H01L 25/18* (2013.01); *H01L 23/3675* (2013.01); *H01L 23/427* (2013.01)

(58) Field of Classification Search
CPC . H01L 23/3675; H01L 23/427; H01L 23/345; H01L 25/18
USPC ................................................. 257/707, 713
See application file for complete search history.

(56) References Cited

U.S. PATENT DOCUMENTS

| 5,396,403 | A | * | 3/1995 | Patel | H01L 23/433 |
| | | | | | 257/713 |
| 5,744,863 | A | * | 4/1998 | Culnane | H01L 21/563 |
| | | | | | 257/704 |
| 5,751,062 | A | * | 5/1998 | Daikoku | H01L 23/4338 |
| | | | | | 257/713 |
| 5,990,550 | A | * | 11/1999 | Umezawa | H01L 23/367 |
| | | | | | 257/697 |
| 6,442,033 | B1 | * | 8/2002 | Liu | H01L 21/563 |
| | | | | | 174/538 |
| 6,580,611 | B1 | * | 6/2003 | Vandentop | H01L 23/367 |
| | | | | | 165/185 |
| 7,084,496 | B2 | * | 8/2006 | Benner | G02B 6/4212 |
| | | | | | 257/678 |
| 7,957,134 | B2 | | 6/2011 | Farnsworth et al. | |
| 7,964,951 | B2 | * | 6/2011 | Refai-Ahmed | H01L 23/10 |
| | | | | | 257/686 |
| 8,385,067 | B2 | | 2/2013 | Arvelo et al. | |
| 8,482,120 | B2 | | 7/2013 | Jafari et al. | |
| 8,541,876 | B2 | * | 9/2013 | Lu | H01L 21/4871 |
| | | | | | 257/706 |
| 9,436,235 | B2 | | 9/2016 | Damaraju | |

(Continued)

*Primary Examiner* — Nitin Parekh
(74) *Attorney, Agent, or Firm* — Polsinelli PC (57) ABSTRACT

The subject disclosure relates to an integrated circuit package having an application specific integrated circuit, a high bandwidth memory, a first heat sink having a first footprint and a first path, and a second heat sink having a second footprint and a second path, wherein the second footprint does not exceed the first footprint. The thermal energy through the first path travels from the application specific integrated circuit to the first heat sink and thermal energy through the second path travel from the high bandwidth memory through one or more heat pipes to the second heat sink.

20 Claims, 8 Drawing Sheets

(56) References Cited

U.S. PATENT DOCUMENTS

| | | | |
|---|---|---|---|
| 9,780,079 B2* | 10/2017 | Li | H01L 25/18 |
| 2002/0158330 A1* | 10/2002 | Moon | H01L 25/0652 |
| | | | 257/707 |
| 2010/0213600 A1* | 8/2010 | Lau | H01L 23/055 |
| | | | 257/693 |
| 2011/0032672 A1 | 2/2011 | Artman et al. | |
| 2013/0141858 A1* | 6/2013 | Pyeon | G06F 1/18 |
| | | | 361/679.31 |
| 2014/0015106 A1* | 1/2014 | Hsieh | H01L 23/562 |
| | | | 257/618 |
| 2015/0255441 A1* | 9/2015 | Lamorey | H01L 25/18 |
| | | | 257/704 |
| 2016/0240455 A1* | 8/2016 | Yun | H01L 23/36 |
| 2016/0300815 A1* | 10/2016 | Kim | H01L 25/0657 |
| 2017/0092619 A1* | 3/2017 | Refai-Ahmed | H01L 25/0655 |

* cited by examiner

COOLING SYSTEM FOR HIGH POWER APPLICATION SPECIFIC INTEGRATED CIRCUIT WITH EMBEDDED HIGH BANDWIDTH MEMORY

FIELD OF TECHNOLOGY

The subject technology relates to cooling systems for application specific integrated circuits, and specifically, cooling systems for a high bandwidth memory embedded in an application specific integrated circuit.

BACKGROUND

An application-specific integrated circuit (ASIC) is an integrated circuit (IC) customized for a particular use, rather than intended for general-purpose use. High Bandwidth Memory (HBM) is a high-performance RAM interface for 3D-stacked DRAM that can be embedded within an ASIC. Generally, heat generated at the ASIC and the HBM have to utilize the same conduction path through the package lid to the primary heat sink. The power dissipation at the HBM is lower compared to that of the ASIC, however, due to smaller form factor, of the HBM, the resulting heat flux can be higher compared to that of the ASIC die (e.g., the HBM can have hot spots). Also, the allowable junction temperature for the HBM and the ASIC can significantly differ. As such, the HBM usually has a max temperature limit which can be 20-25 degrees C. less than that of the ASIC die. Accordingly, the HBM requires more aggressive cooling requirements.

BRIEF DESCRIPTION OF THE DRAWINGS

Certain features of the subject technology are set forth in the appended claims. However, the accompanying drawings, which are included to provide further understanding, illustrate disclosed aspects and together with the description serve to explain the principles of the subject technology. In the drawings:

DETAILED DESCRIPTION

The detailed description set forth below is intended as a description of various configurations of the subject technology and is not intended to represent the only configurations in which the subject technology can be practiced. The appended drawings are incorporated herein and constitute a part of the detailed description. The detailed description includes specific details for the purpose of providing a more thorough understanding of the subject technology. However, it will be clear and apparent that the subject technology is not limited to the specific details set forth herein and may be practiced without these details. In some instances, structures and components are shown in block diagram form in order to avoid obscuring the concepts of the subject technology.

The advancement of ASICs has translated to increased input/output ports on line cards. With the increased input/output ports, the front-to-back air intake capacity is limited (e.g., lower airflow/higher upstream power dissipation). The limited air intake capacity, results in the downstream packages (e.g., ASIC, HBM, heat sinks, etc.) experiencing preheated airflow and lower cooling capacities. To address the cooling requirements of an ASIC with embedded HBM, a cooling system including an integrated micro heat pipe/vapor chamber and a miniature heat sink can be added to the package. The micro heat pipe/vapor chamber and a miniature heat sink can be added, without increasing the footprint of the assembly (e.g., package and primary heat sink) and can create an additional heat transmit path for cooling the HBM. The additional heat transmit path can be in the lateral direction to the HBM. The micro heat pipe/vapor chamber can be in contact with the HBM inside the package. The transmitted heat from the HBM can then be eventually dissipated in the form of forced convection via the secondary miniature heat sink placed underneath the primary heat sink (and attached to the side of the ASIC). Accordingly, the cooling system can provide a secondary cooling path for the HBM, which has a lower allowable junction temperature.

Disclosed is a cooling system including at least an application specific integrated circuit, a high bandwidth memory, and a first and second heat sink. The first heat sink and the second heat sink are not in direct physical contact. Thermal energy from the application specific integrated circuit can be directed through the first heat sink and thermal energy from the high bandwidth memory can at least partially be diverted from the first heat sink to the second heat sink. Also disclosed are one or more heat pipes, wherein the one or more heat pipes at least partially diverts the thermal energy from the high bandwidth memory to the second heat sink and the one or more heat pipes at least partially overlaps the high bandwidth memory. In some examples, at least one of the heat pipes is a vapor chamber.

In some examples, the application specific integrated circuit is adjacent the high bandwidth memory and the second heat sink is adjacent the high bandwidth memory. A vapor chamber/heat pipe passes through the side wall of the ASIC lid, the cold end of the vapor chamber/heat pipe is attached to the second heat sink and the hot end is the attached to the HBM. In some examples, a footprint of the first heat sink is equal to combined footprints of the application specific integrated circuit, the high bandwidth memory, and the second heat sink.

Figure 1:
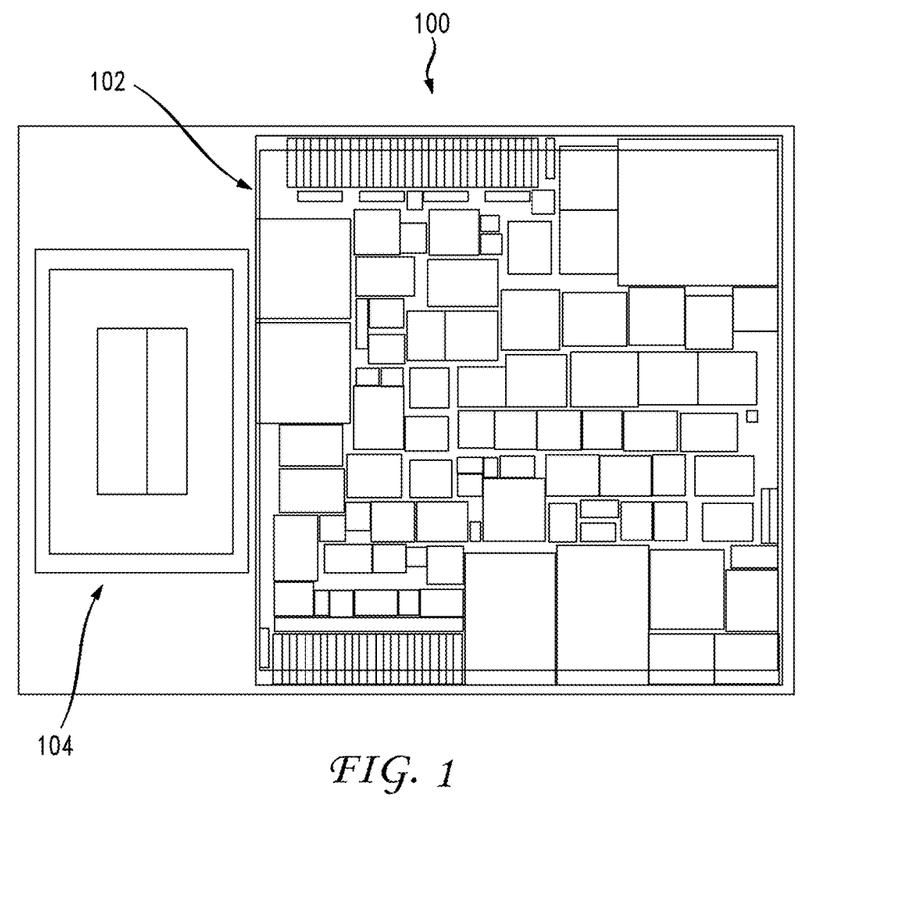
FIG. 1 illustrates a top view of an example ASIC with a single HBM.
Figure 2:
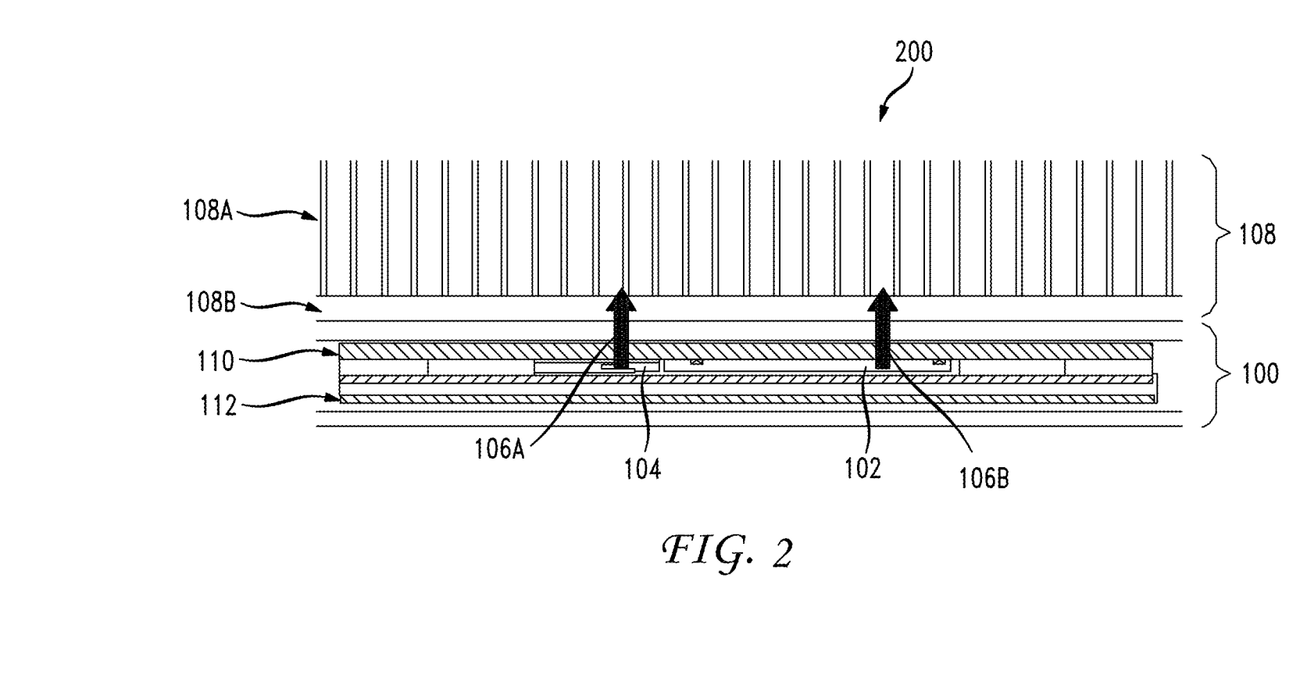
FIG. 2 illustrates a front view of an example ASIC with a single HBM.

FIG. 1 illustrates a top view of an example ASIC with embedded HBM. Package 100 can at least include ASIC 102 and HBM 104. In some examples, HBM 104 can be adjacent ASIC 102. While FIG. 1 illustrates the ASIC and HBM adjacent one another, it should be appreciated that other orientations of the ASIC and HBM are possible. FIG. 2 illustrates a front view of an example ASIC with embedded HBM. Cooling System 200 can include ASIC 102 and HBM 104 set on substrate 112, and primary heat sink 108. Heat sink 108 can include fins 108A and base 108B. Thermal interface material (TIM) 110 can be in between base 108A and package 100 (e.g., attach heat sink 108 to package 100). TIM 110 can enhance the thermal coupling between heat sink 108 and package 100. In some examples, TIM can be thermal grease, thermal glue, thermal gap filler, thermal pad, thermal adhesive, etc. Heat generated from ASIC 102 and HBM 104 can be passively transferred, through TIM 110, to primary heat sink 108, as shown by arrows 106A and 106B. Primary heat sink 108 can transfer the thermal energy from a higher temperature device (e.g., ASIC 102, HBM 104) to a lower temperature fluid medium (e.g., air, etc.).

Figure 3:
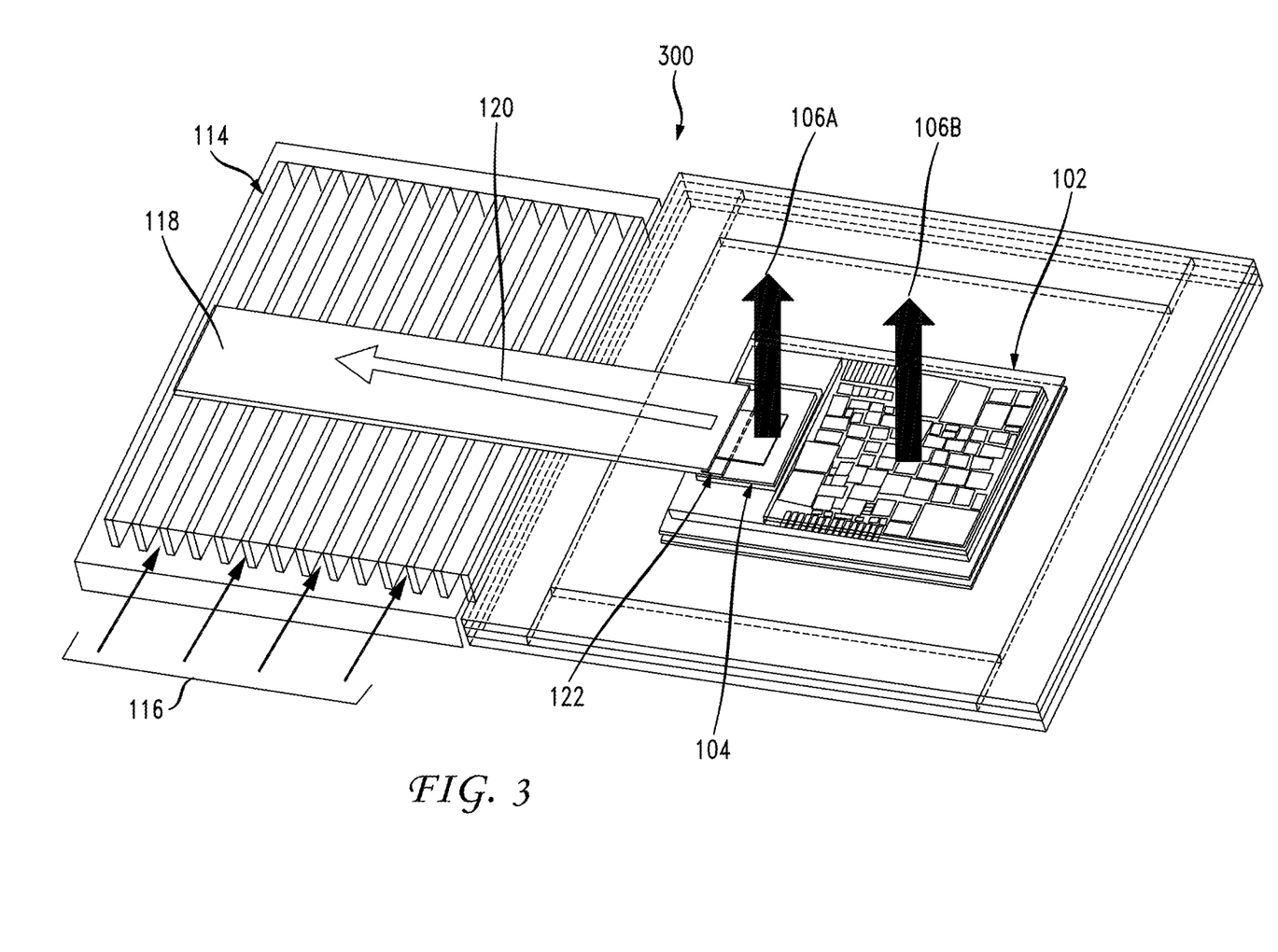
FIG. 3 illustrates a perspective view of an example ASIC with a single HBM and heat pipe.

FIG. 3 illustrates a perspective view of an example ASIC with embedded HBM and heat pipe. Cooling system 300 can include ASIC 102, HBM 104, heat pipe 118 (e.g., integrated micro heat pipe) and secondary heat sink 114 (e.g., miniature heat sink). Heat pipe 118 can provide path 120 (e.g., lateral path) for the transfer of heat (e.g., thermal energy) to secondary heat sink 114 from HBM 104 (e.g., transmitted heat is dissipated in the form of convection via secondary heat sink). The lateral transfer of heat from package 300 can also reduce the load (of thermal energy) on primary heat sink 108 (from ASIC 102).

In some examples, heat pipe 118 can be a micro vapor chamber. Heat pipe 118 can transfer heat from HBM 104 to secondary heat sink 114 by thermal conduction and phase change. At hot end 122 of heat pipe 118, a liquid inside heat pipe 118 (e.g., a thermally conductive solid surface) can turn into a vapor by absorbing heat from HBM 104. The vapor then travels along heat pipe 118 (e.g., via path 120) to secondary heat sink 114 (e.g., cold interface) and condenses back into a liquid and releases the latent heat. The liquid can then returns to hot end 122 through capillary action and the cycle can repeat. In some examples, there can be more than one heat pipe between HBM 104 and secondary heat sink 114. Utilizing more than one heat pipe can spread the heat among the multiple heat pipes enhancing cooling capabilities. In some examples, the one or more heat pipes can be attached to the same vapor chamber base (e.g., hot end 122 of heat pipe 118). Arrows 116 can illustrate the flow of cool air through secondary heat sink 114. While not shown in FIG. 3, the flow of air through primary heat sink 108 in in the same direction as arrows 116.

Figure 4:
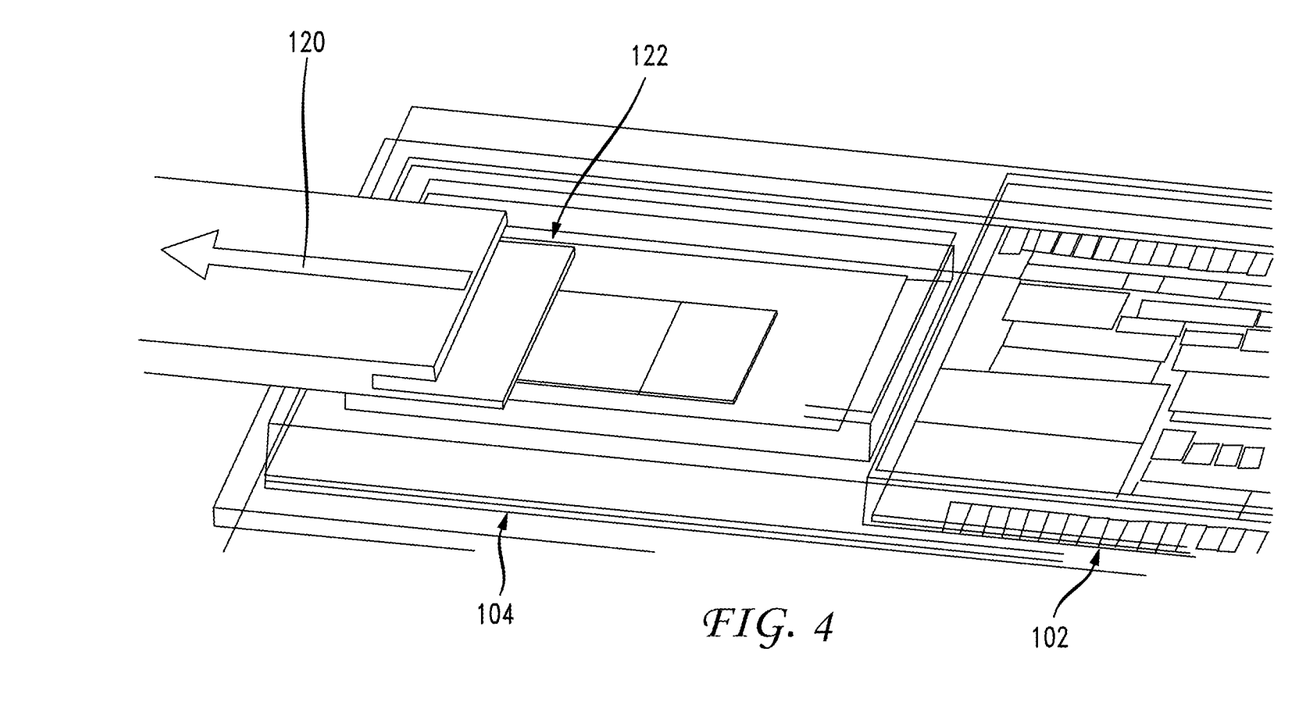
FIG. 4 illustrates a perspective view of an example heat pipe.

The hot end 122 of heat pipe 118 can be shown in detail at FIG. 4. As shown in FIG. 4, hot end 122 can overlap at least a portion of HBM 104. In some examples, hot end 122 can extend to substantially the entire length of HBM 104. In other examples, the hot end 112 can extend the entire length of HBM 104. In other examples, hot end 122 can extend across HBM 104 at differing lengths. The extent of overlapping portions between hot end 122 and HBM 104 can provide differing cooling characteristics (e.g., the larger amount of overlap, the greater cooling through path 120). As shown in FIG. 4, the partial overlap of heat interface 122 and HBM 104 can result in a majority (e.g., approximately 80%) of HBM's thermal energy being dissipated via path 120 created by the heat pipe 118. In other examples, when heat interface 122 of heat pipe 118 overlaps substantially the entire length of HBM 104, approximately substantially all of HBM's thermal energy can be dissipated via path 120.

Figure 5A:
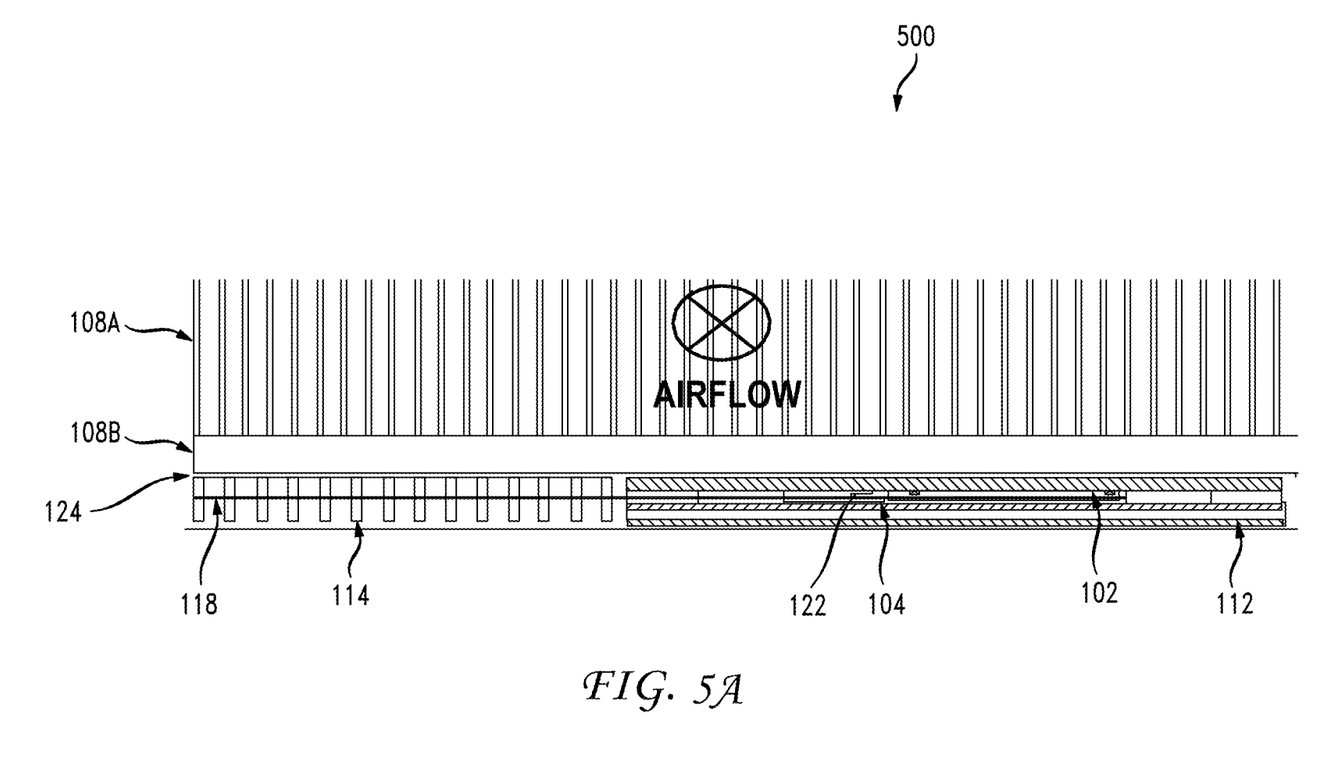
FIG. 5A illustrates a front view of an example ASIC with a single HBM.
Figure 5B:
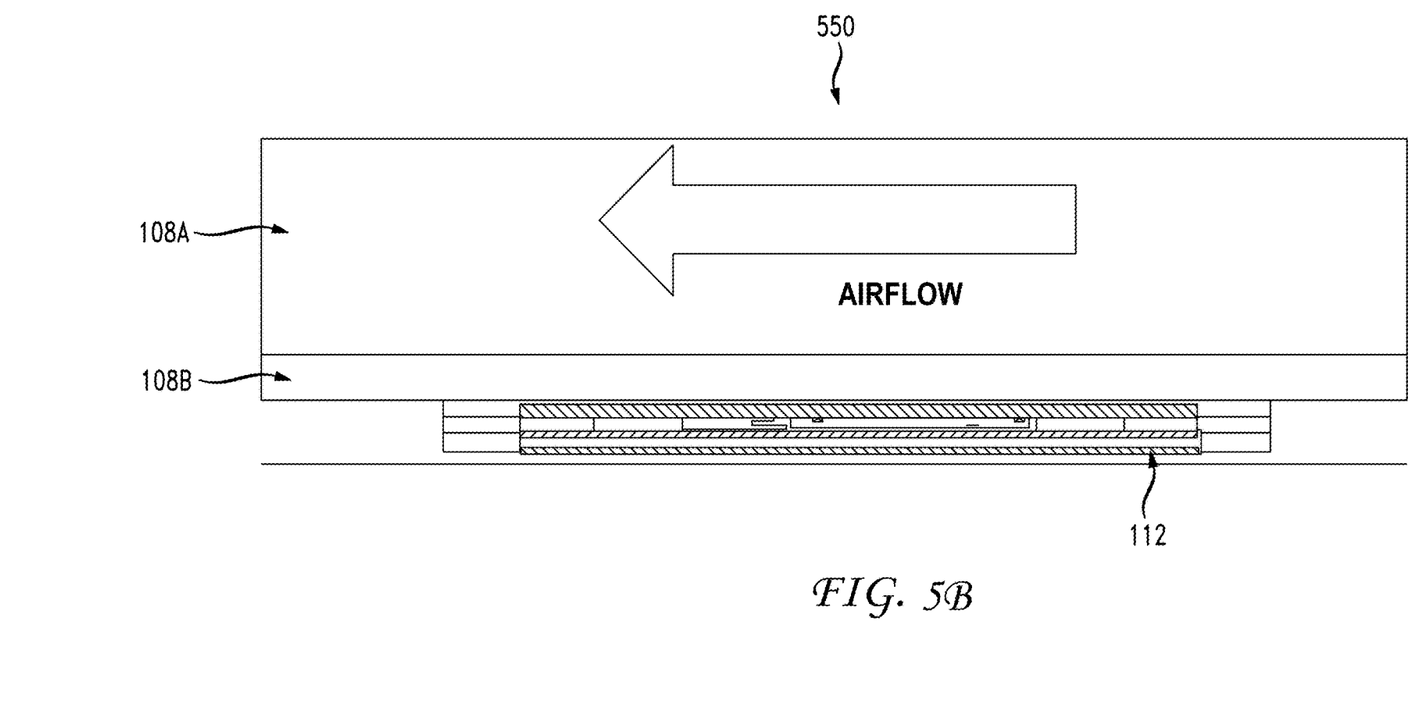
FIG. 5B illustrates a side view of an example ASIC with a single HBM.

FIG. 5A illustrates a front view and FIG. 5B illustrates a side view of an example ASIC with embedded HBM and heat pipe. Cooling systems 500, 550 can at least include ASIC 102, HBM 104, primary heat sink 108, heat pipe 118 and secondary heat sink 114. As illustrated in FIG. 5A, primary heat sink 108 and secondary heat sink 114 are not in direct physical contact (e.g., separated by space 124). By not being in direct physical contact, the primary and secondary heat sinks can establish distinct thermal energy paths (e.g., 106A and 106B, and 120). Establishing distinct thermal energy paths can enable more efficient dissipation of thermal energy from ASIC 102 (e.g., through primary heat sink 108) and from HBM 104 (e.g., laterally through heat pipe 118 to secondary heat sink 114). In examples where there is direct contact between the primary and secondary heat sink, efficient of dissipation of thermal energy is reduced (e.g., there are no distinct thermal energy paths).

As further illustrated in FIGS. 5A and 5B, the overall footprint of cooling systems 500, 550 (e.g., size of primary heat sink 108) is not increased with the addition of secondary heat sink 104 and heat pipe 118. The arrangement of the elements (e.g., 102, 104, 108, 110, 112, 114, 118, 122) can be in any order, as long as the overall footprint is not exceeded and the airflow through the primary and secondary heat sinks are in similar directions. In other examples, different types of packages can be presented. For example, package 100 can include ASIC 102 and not HBM 104. HBM can be added as a separate element to the cooling systems (e.g. 200, 300, 500, 550). FIG. 5A and FIG. 5B can also illustrate the direction airflow through primary heat sink 108 and secondary heat sink 114.

Figure 6A:
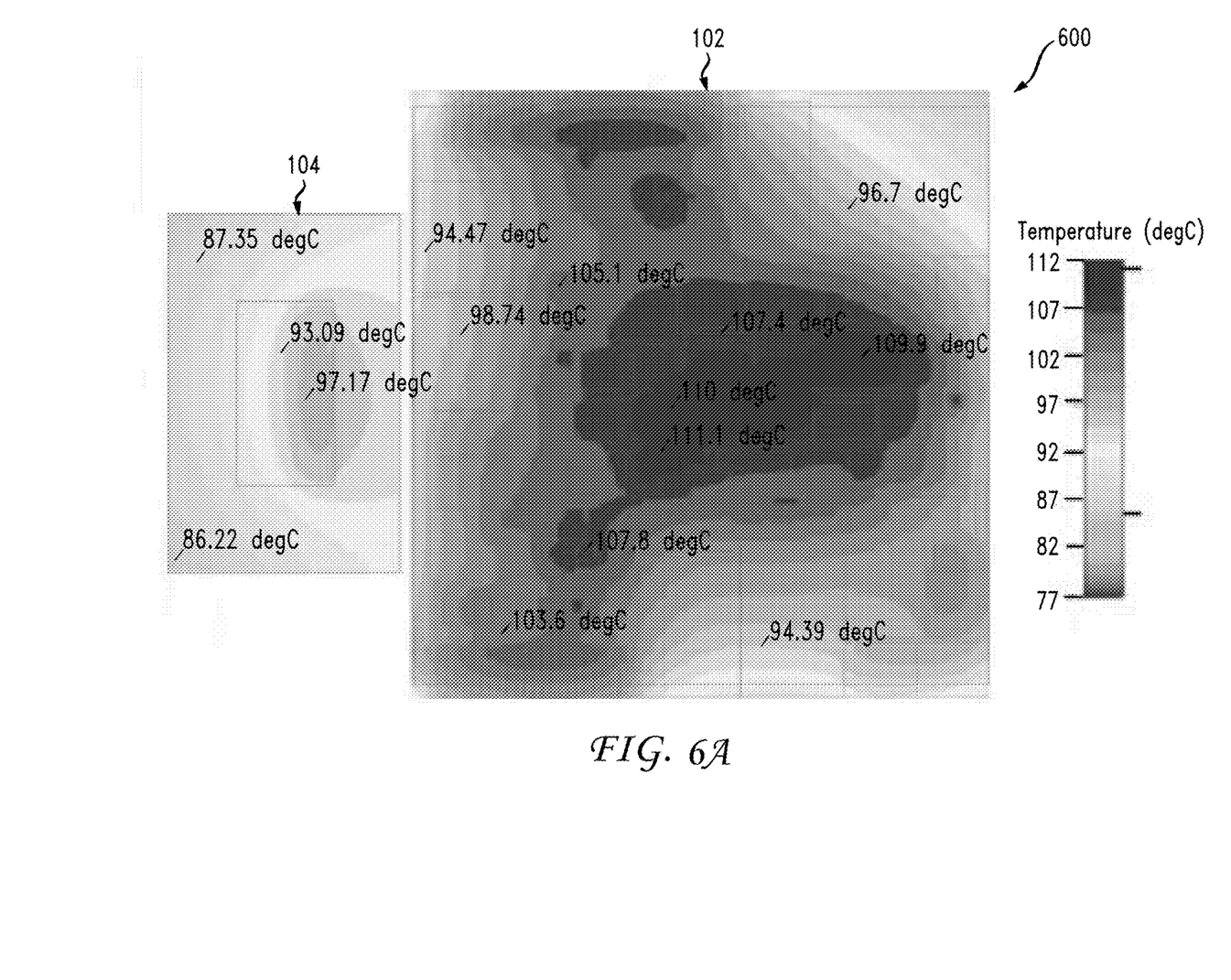
FIG. 6A illustrates an example heat map of an example ASIC with a single HBM.
Figure 6B:
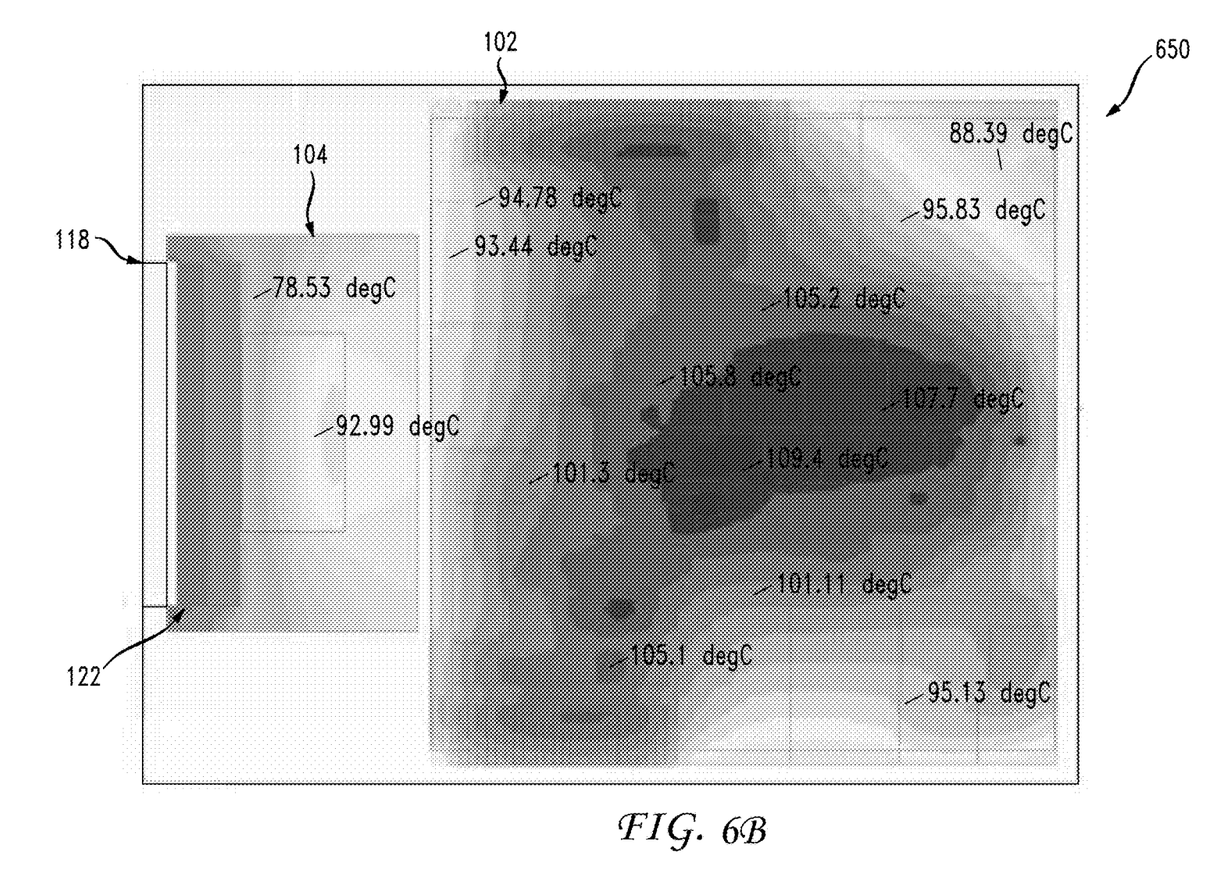
FIG. 6B illustrates an example heat map of an example ASIC with a single HBM and heat pipe.

FIGS. 6A and 6B are example heat maps illustrating temperatures of the ASIC and embedded HBM without 600 and with 650 the heat pipe, respectively. It should be appreciated FIGS. 6A and 6B are provided as examples and the temperatures and data reflected should be not considered limiting. As illustrated in FIG. 6A, the maximum temperature of ASIC 102 is 111.1 C and, the maximum temperature of HBM 104 is 97.2 C. As illustrated in FIG. 6B, with the addition of heat pipe 118, the resulting dissipation of heat from HBM 104, the maximum temperature of ASIC 102 is 109.9 C and the maximum temperature of HBM 104 is 93.3 C. The addition of heat pipe 118 can decrease the maximum temperature of HBM at least approximately 4 C (in the illustrated orientation). It can be appreciated, in examples where heat pipe 118 extends across HBM 104, a larger decrease in maximum temperature can occur. The maximum temperatures when utilizing the heat pipes in an ASIC with embedded HBM can be approximately 78 C in the heat pipe, 93.3 in the HBM, and 109.9 in the ASIC. The remaining thermal energy from the HBM (e.g., thermal energy not dissipated via the heat pipe) is still dissipated through the primary heat sink (e.g., 106A). It can also be appreciated, that the temperature values above are provided as an example, and the temperature values are variable from one application to the next. The example temperature values are also illustrated to show a gradient (or differences) between the ASIC with an embedded HBM with and without the cooling configuration and having a gradient (from without to with) equal to or below the maximum temperature of the HBM.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more."

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa.

The word "exemplary" is used herein to mean "serving as an example or illustration." Any aspect or design described herein as "exemplary" is not necessarily to be construed as preferred or advantageous over other aspects or designs.

What is claimed is:

1. A cooling system comprising:
an application specific integrated circuit (ASIC) set on a substrate;
a high bandwidth memory (HBM) set on the substrate;
a first heat sink attached to the ASIC and the HBM by a thermal interface material; and
a second heat sink attached to the HBM via a heat pipe;
wherein the first heat sink is configured to direct thermal energy away from the ASIC and the HBM, and wherein the second heat sink is configured to at least partially divert thermal energy away from the HBM.

2. The cooling system of claim 1, wherein the ASIC is adjacent to the HBM.

3. The cooling system of claim 2, wherein the second heat sink is adjacent the HBM.

4. The cooling system of claim 3, wherein a footprint of the first heat sink is equal to combined footprints of the ASIC, the HBM, and the second heat sink.

5. The cooling system of claim 1, further comprising one or more heat pipes, wherein the one or more heat pipes are configured to at least partially divert the thermal energy from the HBM to the second heat sink.

6. The cooling system of claim 5, wherein at least one of the heat pipes is a vapor chamber.

7. The cooling system of claim 5, wherein the one or more heat pipes at least partially overlaps the HBM.

8. The cooling system of claim 5, wherein a majority of thermal energy of the HBM is dissipated via the one or more heat pipes.

9. The cooling system of claim 1, wherein the first heat sink and the second heat sink are not in direct physical contact.

10. An integrated circuit package comprising:
a first heat sink having a first footprint and a first path; and
an application specific integrated circuit (ASIC), a high bandwidth memory (HBM), a second path, and a second heat sink having a second footprint, wherein the second footprint does not exceed the first footprint,
wherein the ASIC, the HBM, and second heat sink are set on a substrate and the first heat sink is attached to the ASIC and the HBM by a thermal interface material,
wherein thermal energy from the ASIC and the HBM are diverted through the first path to the first heat sink and thermal energy from the HBM is at least partially diverted through the second path to the second heat sink via a heat pipe.

11. The integrated circuit package of claim 10, further comprising one or more heat pipes, wherein the heat pipes form the second path.

12. The integrated circuit package of claim 11, wherein the one or more heat pipes at least partially overlaps the HBM.

13. The integrated circuit package of claim 11, wherein at least one of one or more heat pipes is a vapor chamber.

14. The integrated circuit package of claim 10, wherein the ASIC is adjacent the HBM.

15. The integrated circuit package of claim 10, wherein the second heat sink is adjacent the HBM.

16. The integrated circuit package of claim 10, wherein the first heat sink and the second heat sink are not in direct physical contact.

17. An integrated circuit package comprising:
a first heat sink having a first footprint and a first path; and
an application specific integrated circuit (ASIC), a high bandwidth memory (HBM), a second path, and a second heat sink having a second footprint, wherein the second footprint does not exceed the first footprint,
wherein the ASIC, the HBM, and second heat sink are set on a substrate and the first heat sink is attached to the ASIC and the HBM by a thermal interface material,
wherein thermal energy from the ASIC and the HBM are diverted through the first path to the first heat sink and thermal energy from the HBM is at least partially diverted through the second path by one or more heat pipes to the second heat sink.

18. The integrated circuit package of claim 17, wherein the ASIC is adjacent the HBM.

19. The integrated circuit package of claim 17, wherein the second heat sink is adjacent the HBM.

20. The integrated circuit package of claim 17, wherein the first heat sink and the second heat sink are not in direct physical contact.

* * * * *